(12) United States Patent
Parris et al.

(10) Patent No.: US 8,281,219 B2
(45) Date of Patent: Oct. 2, 2012

(54) ERROR CORRECTION CODE (ECC) CIRCUIT TEST MODE

(75) Inventors: Michael C. Parris, Colorado Springs, CO (US); Oscar Frederick Jones, Jr., Colorado Springs, CO (US)

(73) Assignee: Invensas Corporation, San Jose, CA (US)

( * ) Notice: Subject to any disclaimer, the term of this patent is extended or adjusted under 35 U.S.C. 154(b) by 1364 days.

(21) Appl. No.: 11/840,203

(22) Filed: Aug. 16, 2007

(65) Prior Publication Data

US 2009/0049350 A1    Feb. 19, 2009

(51) Int. Cl.
*G11C 29/00* (2006.01)
(52) U.S. Cl. ........................... 714/764; 714/720
(58) Field of Classification Search .................. 714/764, 714/720
See application file for complete search history.

(56) References Cited

U.S. PATENT DOCUMENTS 5,502,732 A * 3/1996 Arroyo et al. ................. 714/746

\* cited by examiner

*Primary Examiner* — Guy Lamarre
(74) *Attorney, Agent, or Firm* — Lerner, David, Littenberg, Krumholz & Mentlik, LLP

(57) ABSTRACT

An ECC circuit and method for an integrated circuit memory allows a user to enter a test mode and select a specific location to force a known failure on any memory chip, whether it is fully functional or partially functional. Additional circuitry is placed in the data path where existing buffers and drivers are already located, minimizing any additional speed loss or area penalty required to implement the forced data failure. In a first general method, a logic zero is forced onto a selected data line at a given time. In a second general method, a logic one is forced onto a selected data line at a given time.

20 Claims, 5 Drawing Sheets

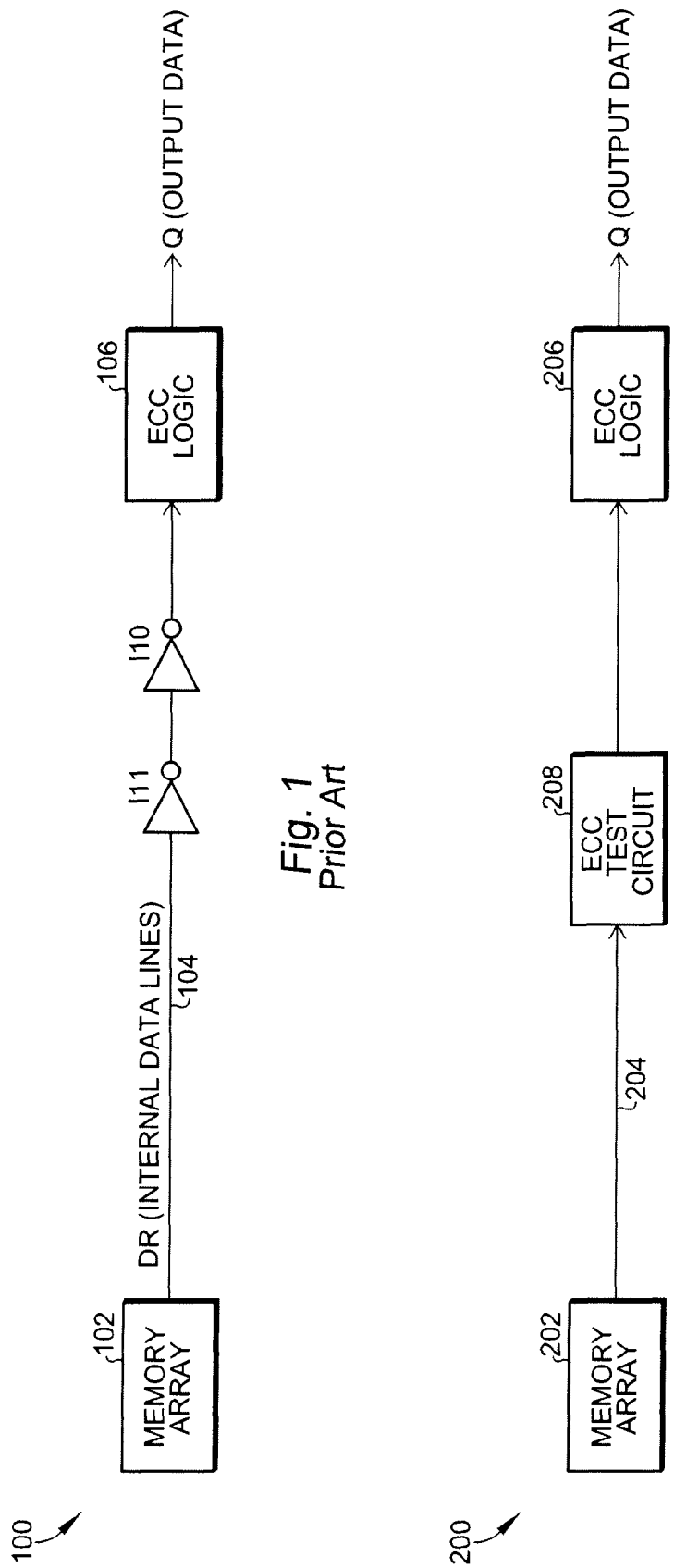

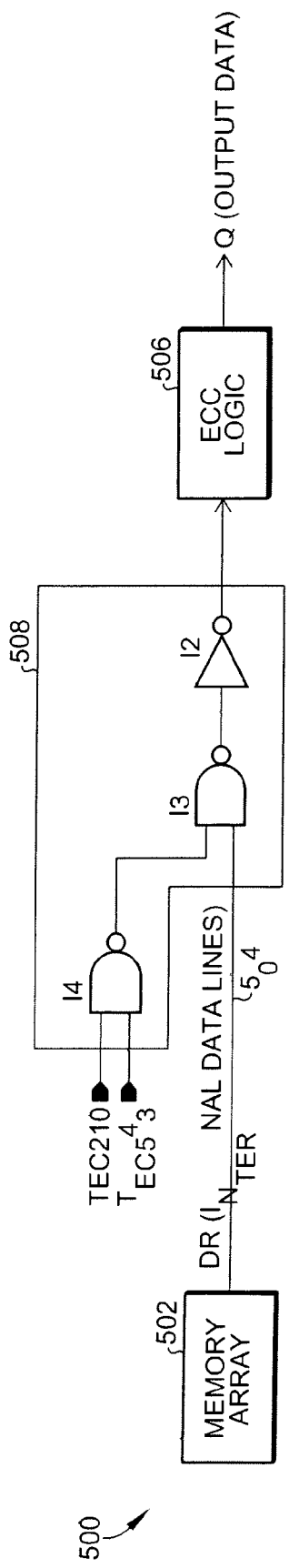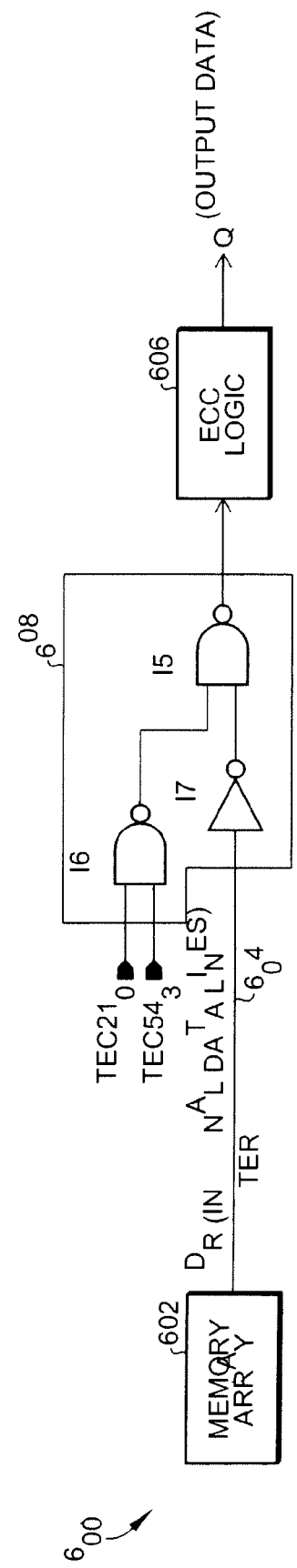

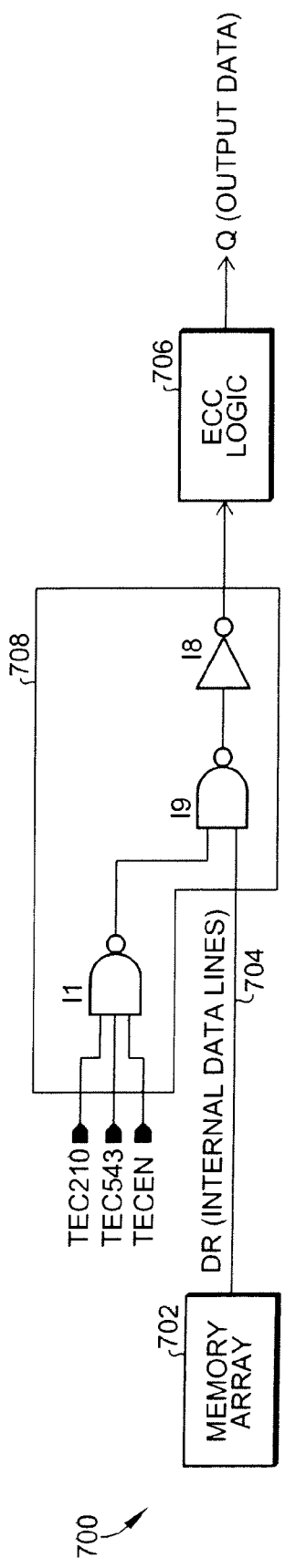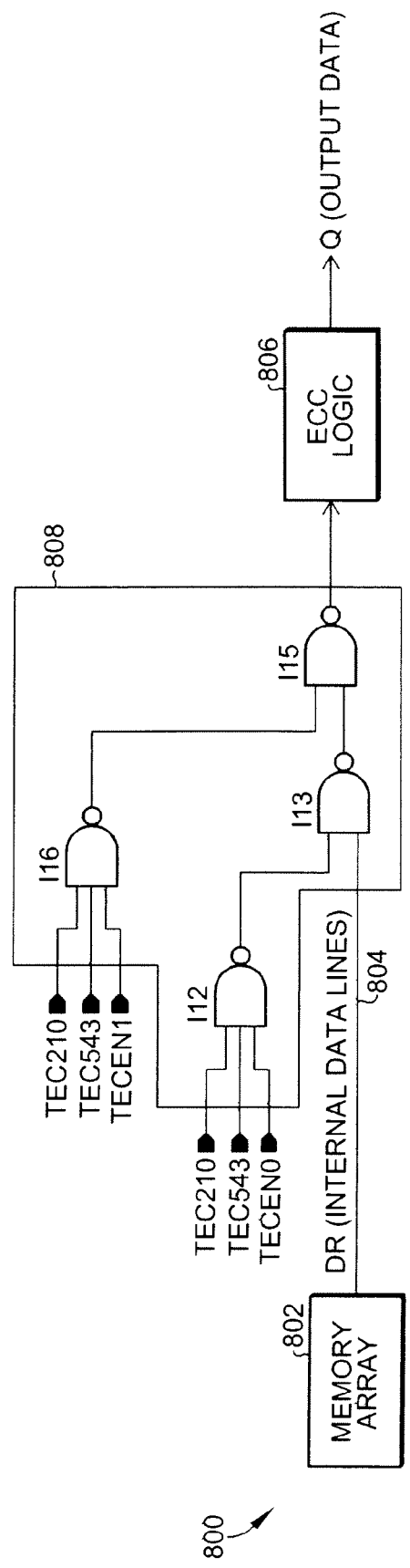

ERROR CORRECTION CODE (ECC) CIRCUIT TEST MODE

BACKGROUND OF THE INVENTION

The present invention relates to integrated circuit memories and, more particularly, to a test mode for the ECC circuitry resident on the integrated circuit memory.

Error Correction Circuit or ECC logic blocks have been included with integrated memory circuits for many years. Some of the ECC circuits used detect errors in the memory and notify the system that an error occurred, other ECC circuits detect and correct any errors found if they are under a correctable threshold. The types of ECC circuits and their thresholds for detecting or correcting depend on how many parity or check bits are used and the type of ECC algorithm used. A common means to test the ECC circuit block is to turn off or disable the correction circuitry and then identify a memory that has at least one data bit or one address location failing. The ECC block is then enabled and the memory retested to see if the error is in fact detected by the ECC and become corrected if the appropriate circuitry is present. This prior art testing procedure is time consuming and does not guarantee that the ECC logic will detect or correct failures at all address locations or on all data I/Os. Further, this prior art testing procedure does not indicate that the ECC logic will work on every memory circuit on the wafer.

Another method of testing ECC circuitry in the past involved turning off or masking the check bits from being written to their appropriate value. A specific I/O is then written to a new data value. If the ECC circuit being testing offers single bit (or more) correction, the current I/O will be corrected and will output the original data when read with the ECC check bits enabled again. This method requires several steps to implement and slows down the production testing speed. Also, disabling or masking these check bits are often difficult due to the physical location of the bits which may be distributed throughout a memory array. For fully functional memories it is assumed that the ECC logic will work and detect "soft" failures in the field if any do appear over time due to noise, radiation, or some design marginality. Without a specific test mode the ECC logic block can not be guaranteed to work for all die.

FIG. 1 shows a portion of an integrated circuit memory 100 including a memory array 102, a representative internal data line 104, and ECC logic 106 according to the prior art. The data from memory array 102 typically is buffered with data path drivers/buffers I11 and I10. After buffering, the memory array data is corrected by the ECC logic and corrected output data is provided at the Q output data terminal.

What is desired, therefore, is a circuit and corresponding method for providing a test mode for the error correction circuit resident in an integrated circuit memory that overcomes the deficiencies of the prior art, yet is able to be practically integrated onto the same integrated circuit with the memory array.

SUMMARY OF THE INVENTION

The present invention overcomes the above-mentioned deficiencies in prior art. The present invention is a circuit and corresponding method that allows the user to enter a test mode and select a specific location to force a known failure on any memory chip, whether it is fully functional or just partially functional. The additional circuitry according to the present invention can be placed in the data path where existing buffers and drivers are already located, minimizing any additional speed loss or area penalty required to implement the forced data failure. In a first general method according to the present invention, a logic zero is forced onto a selected data line at a given time. In a second general method according to the present invention, a logic one is forced onto a selected data line at a given time.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 1 is a schematic/block diagram of an error-correcting memory according to the prior art;

FIG. 2 is a simplified block diagram of an error-correcting memory according to the present invention;

FIG. 5 is a schematic/block diagram of a first implementation of the first embodiment of the invention;

FIG. 6 is a schematic/block diagram of a second implementation of the first embodiment of the invention;

FIG. 7 is a schematic/block diagram of a first implementation of the second embodiment of the invention;

FIG. 8 is a schematic/block diagram of a second implementation of the second embodiment of the invention.

DETAILED DESCRIPTION

According to the present invention, an integrated circuit memory 200 including an ECC circuit test mode is shown in FIG. 2, including a memory array 202 coupled to an internal data line 204, an ECC logic circuit 206 for providing correct output data, and forcing logic 208 interposed between the internal data line 204 and the input of the ECC logic circuit 206.

Figure 3:
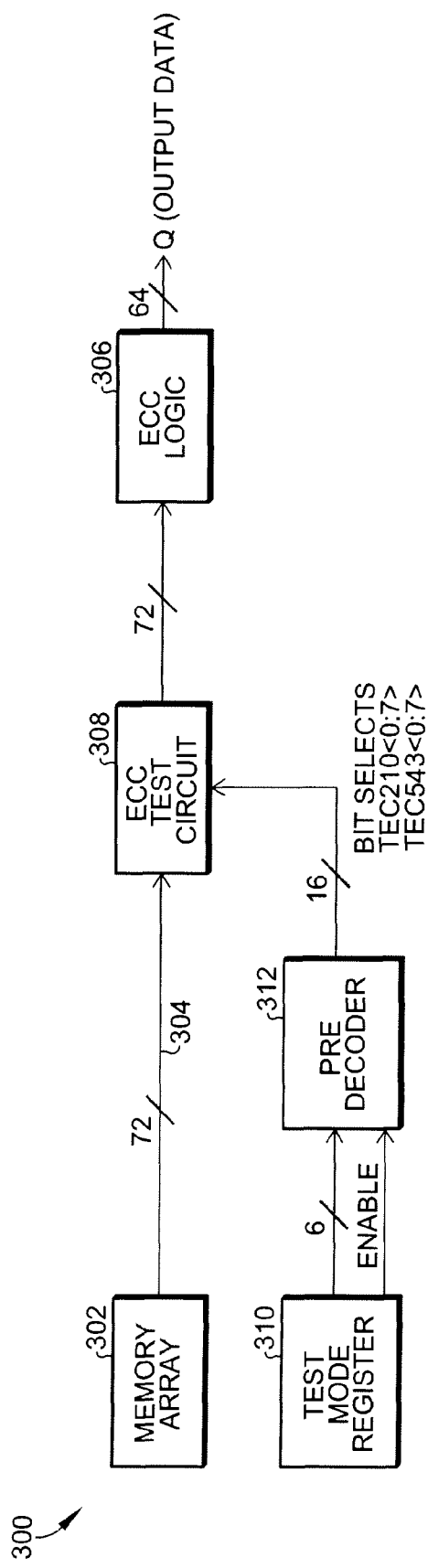
FIG. 3 is a block diagram of a first embodiment of the present invention, showing a test mode register and a pre-decoder not shown in FIG. 2.

According to a first embodiment of the present invention, an integrated circuit memory 300 including an ECC circuit test mode is shown in FIG. 3, including a memory array 302 coupled to an internal data line 304, an ECC logic circuit 306 for providing correct output data, and forcing logic 308 interposed between the internal data line 304 and the input of the ECC logic circuit 306. Additional circuit details are shown in FIG. 3, wherein a test mode register 310 is coupled to a predecoder 312. The predecoder 312 is in turn coupled to the ECC test circuit 308. In the embodiment of FIG. 3, an enable signal is generated in the test mode register and received by the predecoder 312.

Figure 4:
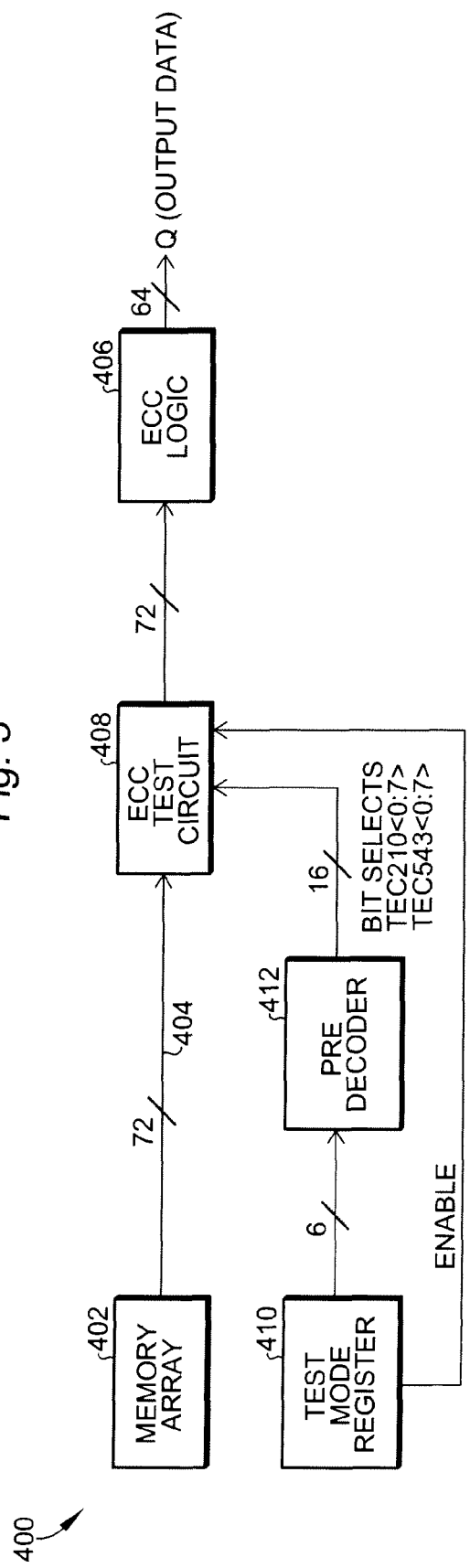
FIG. 4 is a block diagram of a second embodiment of the present invention, also showing a test mode register and a pre-decoder not shown in FIG. 2.

According to a second embodiment of the present invention, an integrated circuit memory 400 including an ECC circuit test mode is shown in FIG. 4, including a memory array 402 coupled to an internal data line 404, an ECC logic circuit 406 for providing correct output data, and forcing logic 408 interposed between the internal data line 404 and the input of the ECC logic circuit 406. Additional circuit details are shown in FIG. 4, wherein a test mode register 410 is coupled to a predecoder 412. The predecoder 412 is in turn coupled to the ECC test circuit 408. In the embodiment of FIG. 4, an enable signal is generated in the test mode register and received directly by the ECC test circuit 408.

Referring generally to FIGS. 2-4, by decoding test mode register bits to select the internal data read line or lines desired, a failure can be generated on one or more data lines of a specific word. ECC can then be used to correct these failures and tested for functionality. ECC logic according to the present invention provides the means for single bit correction in a 64 bit data word so a single internal data line is used for forcing data in implementing the invention. In the present invention there are eight different 64 bit data words on a memory block and the invention was designed to operate in parallel on all the data words, testing the same data bit of each word. For example, six test mode register bits are loaded prior to the test. When the ENABLE signal goes active then these six bits are used to select one internal data line of 64 data lines that make up a 64 bit word to force to a specific data state when reading the memory. A pattern of solid zeros can be written to the memory, and then read for verification. If the test mode forces a one on a single bit in the word, the ECC circuitry detects this as a failure and corrects the failure so that a zero is still read on all the bits and outputted to the outside world or other circuit blocks in a SOC (System On a Chip) type circuit.

The method of the present invention works for many different data patterns, such as checker board, stripes, zero in a field of ones, one in a field of zeros, march pattern etc. As long as the data bit selected to force to a one is written to a zero, the ECC circuitry will be tested to ensure that the error is detected and/or corrected. If the read data is expected to be a one and one is forced by the invention, no change or interruption to the test will be made. This selected forced data bit can be moved to different times or address locations by changing when the ENABLE signal is active. Also the selected data bit can be moved by changing which of the I/Os are selected with a different combination of test mode register bits. The selected data bit in a word can be the same on all data words in a memory or for just a single word and then moved on to a different word. The invention was implemented in this circuitry to be typically held in this test mode for a burst of address locations to verify that detection and correction will be successful for multiple address locations.

FIG. 5 shows a portion of an integrated circuit memory 500 including a memory array 502, a representative internal data line 504, and ECC logic 506. The circuit shown in FIG. 5 generally corresponds to the embodiment shown in FIG. 2. The data from memory array 502 is buffered with forcing logic I2, I3, and I4 in test circuit 508 according to the first embodiment of the present invention. Forcing logic I2, I3, and I4 is used to force a logic zero on a select data bit at the input to the ECC logic 506. NAND gate I4 receives the TEC210 and TEC543 input signals. A logic zero is forced onto the ECC logic 506 input when both TEC210 and TEC543 input signals are a logic one. The TEC210 designation refers to (Test ECC predecoded bits 2, 1, and 0) and the TEC543 designation refers to (Test ECC predecoded bits 5, 4, and 3). The TEC210 and TEC543 signals are both used to force a logic zero at the input to ECC logic 206 because when they go high on the selected internal I/Os the output of I4 goes low, thus forcing the output of I3 to go high so that inverter I2 goes low. However, it is apparent to those skilled in the art that one or more forcing input signals can be used for a particular implementation, depending, for example, on the number of the test register bits and the exact nature of the decoding circuitry used. NAND gate I3 receives the output of the NAND gate I4, which is a logic zero when forcing input signals TEC210 and TEC543 are both high. Since NAND gate I3 receives a logic zero input, the output of NAND gate I3 is forced to a logic one. Inverter I2 inverts the logic signal to a logic zero, which is provided to the output of ECC logic circuit 206. Logic circuitry I2, I3, and I4 maintains the driving/buffering functionality provided by the prior art, and also includes a forcing function for testing the ECC logic 206, without a significant increase in the number of components used, or an increase in integrated circuit die area.

FIG. 6 shows a portion of an integrated circuit memory 600 including a memory array 602, a representative internal data line 604, and ECC logic 606. Again, the circuit of FIG. 6 generally corresponds to the first embodiment of the invention shown in FIG. 2. The data from memory array 602 is buffered with forcing logic I2, I3, and I4 in test circuit 608 according to the first embodiment of the present invention. Forcing logic I5, I6, and I7 is used to force a logic one on a select data bit at the input to the ECC logic 606. NAND gate I6 receives the TEC210 and TEC543 input signals. A logic one is forced onto the ECC logic 606 input when both TEC210 and TEC543 input signals are a logic one. NAND gate I5 receives the output of the NAND gate I6, which is a logic zero when forcing input signals TEC210 and TEC543 are both high. Since NAND gate I3 receives a logic zero input, the output of NAND gate I5 is forced to a logic one which, is provided to the output of ECC logic circuit 606. Inverter I7 is necessary to provide the correct logic phase of the data from memory array 602. Logic circuitry I5, I6, and I7 thus maintains the driving/buffering functionality provided by the prior art, and also includes a forcing function for testing the ECC logic 606, without a significant increase in the number of components used, or an increase in integrated circuit die area.

It should be noted that in the first embodiment of the invention shown in FIGS. 3, 5, and 6 the ENABLE function, also referred to as the TECEN function in later drawings (Test ECC Enable) is embedded in with the TEC address decoding in forcing input signals TEC210 and TEC543.

A second embodiment of the present invention shown in FIG. 7 generally corresponds to the circuit shown in FIG. 3. The circuit 700 of FIG. 7 thus includes a dedicated TECEN signal in addition to the TEC210 and TEC543 forcing input signals previously described. A portion of an integrated circuit memory 700 is shown including memory array 702, data line 704, and ECC logic 706, and includes forcing logic I1, I8, and I9. NAND gate I1 includes three inputs for receiving the TEC210, TEC543, and TECEN input signals. The TECEN input signal is used to allow a logic zero to be forced onto the input of ECC logic 706 only during selected times, even if the TEC210 and TEC543 input signals are both high.

An alternative circuit for the second embodiment of the present invention is shown in FIG. 8 and generally corresponds to the circuit shown in FIG. 3. The circuit includes two dedicated TECEN control input signals TECEN0 and TECEN1 in addition to the TEC210 and TEC543 signals previously described to allow the forcing of a one or a zero on the selected internal data read line. A portion of an integrated circuit memory 800 is shown including memory array 802, data line 804, and ECC logic 806, and includes forcing logic I12, I13, I15, and I16 in order to force either a logic zero or a logic one onto the input of ECC logic 506. NAND gate I12 includes three inputs for receiving the TEC210, TEC543, and TECEN0 input signals. NAND gate I16 includes three inputs for receiving the TEC210, TEC543, and TECEN1 input signals. The TECEN0 and TECEN1 input signals are used to allow a logic one or a logic zero to be forced onto the input of ECC logic 806 only during selected times, even if the TEC210 and TEC543 input signals are both high.

The present invention can also be used to force double bit errors. Some ECC circuits can correct two bits in a given data word. In this case, the present invention can be used to test the ECC circuit by reducing one address for the forced error selection or test ECC (TEC address) and force an error on two bits instead of one.

Figure 9:
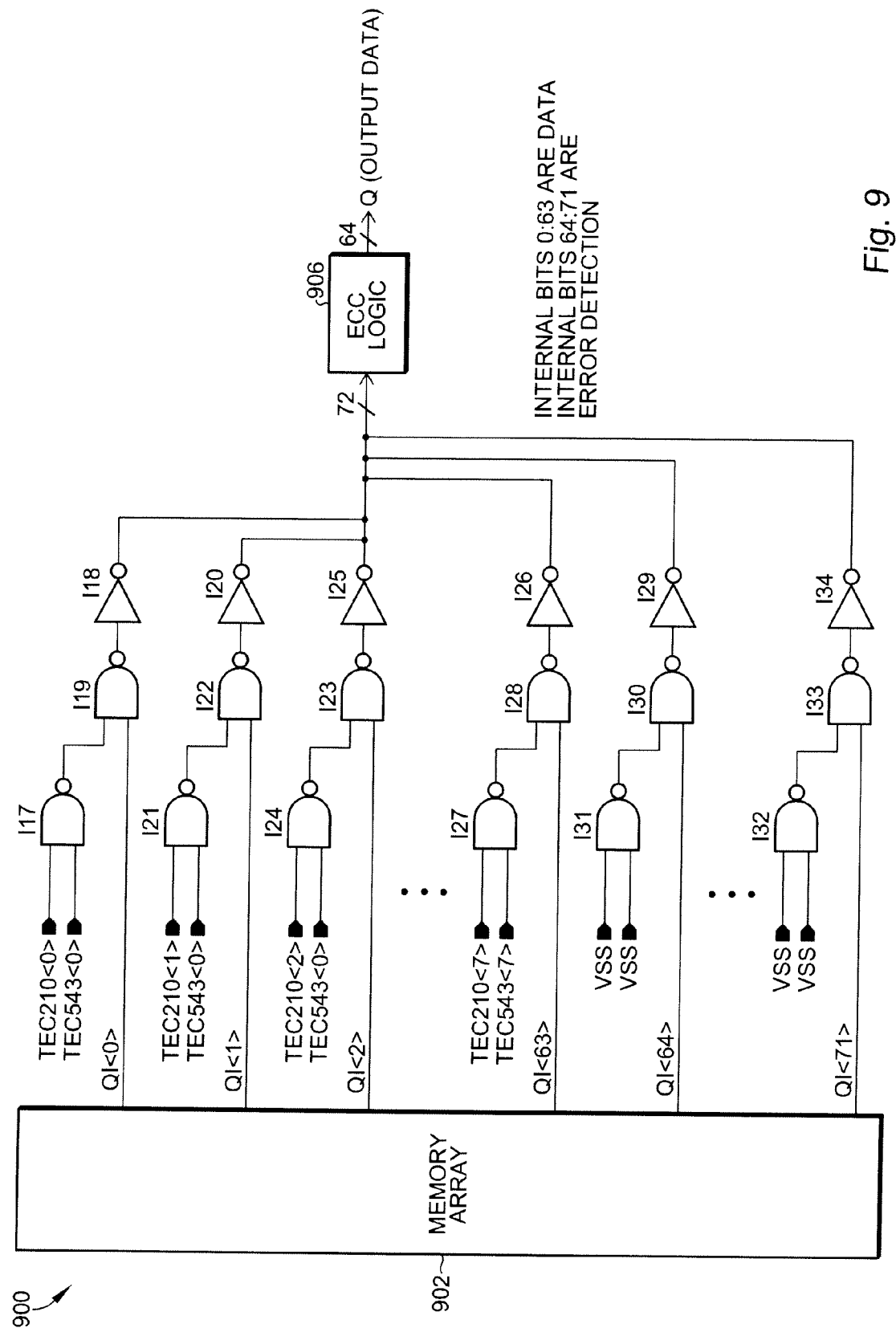
FIG. 9 is a schematic/block diagram of the present invention showing an implementation of a memory according to the present invention including both data and error detection bits.

An implementation of the present invention 900 is shown in FIG. 9 that includes a memory array 902, ECC logic 906, and forcing logic including NAND gates I17, I21, I24, I27, I31, and I32, NAND gates I19, I22, I23, I28, I30, and I33, and inverters I18, I20, I25, I26, I29, and I34. The memory array 902 is used to generate output signals QI<0 >, QI<1 >, QI<2 > through QI<63 >, QI<64 > through QI<71 >, which are received by NAND gates I19, I22, I23, I28, I30, and I33. In this embodiment, internal bits 0:63 are used for data, and internal bits 64:71 are used for error detection. Note that NAND gates I17, I21, I24, I27, I31, and I32 receive the TEC210 and TEC543 signals, whereas NAND gates I31 through I32 are coupled to VSS. In the first instance, the TEC210 and TEC543 signals are used to select one of 64 internal bits to force an error, thereby testing the ECC logic for detection and/or correction. In the second instance, the NAND gate inputs coupled to VSS are used so that the ECC bits contain the same load and number of gate delays in their path as the regular data bits 0-63 and their delay is matched. Circuit 900 shows a specific implementation of the invention for a memory architecture containing a 64 bit wide data word and eight additional data bits for detecting single or double bit errors and correcting single bit errors. Circuit 900 can be used in applications where this 72 bit ECC architecture is used.

While there have been described above the principles of the present invention in conjunction with specific logic designs and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicant hereby reserves the right to formulate new claims to such features and/or combinations of such features during the prosecution of the present application or of any further application derived therefrom.

We claim:

1. An integrated circuit memory comprising:
a memory array coupled to an internal data line;
an ECC logic circuit for providing correct output data; and
forcing logic interposed between the internal data line and an input of the ECC logic circuit to force a specific data state on a select data bit onto the input of the ECC logic circuit when the memory array is read.

2. The integrated circuit memory of claim 1 wherein the forcing logic comprises at least one control signal input.

3. The integrated circuit memory of claim 1 wherein the forcing logic forces a logic zero onto the input of the ECC logic circuit.

4. The integrated circuit memory of claim 1 wherein the forcing logic forces a logic one onto the input of the ECC logic circuit.

5. The integrated circuit memory of claim 1 wherein the forcing logic selectively forces either a logic zero or a logic one onto the input of the ECC logic circuit.

6. The integrated circuit memory of claim 1 wherein the forcing logic comprises:
a first NAND gate having two inputs for receiving two control signals and an output;
a second NAND gate having a first input coupled to the output of the first NAND gate, a second input coupled to the internal data line, and an output; and
an inverter having an input coupled to the output of the second NAND gate and an output coupled to the input of the ECC logic circuit.

7. The integrated circuit memory of claim 6 wherein the first NAND gate comprises an additional input for receiving an additional control signal.

8. The integrated circuit memory of claim 1 wherein the forcing logic comprises:
a first NAND gate having two inputs for receiving two control signals and an output;
a second NAND gate having a first input coupled to the output of the first NAND gate, a second input, and an output coupled to the input of the ECC logic circuit; and
an inverter having an input coupled to the internal data line and an output coupled to the second input of the second NAND gate.

9. The integrated circuit memory of claim 1 wherein the forcing logic comprises:
a first logic portion capable of forcing a logic zero onto the input of the ECC logic circuit; and
a second logic portion capable of forcing a logic one onto the input of the ECC logic circuit.

10. The integrated circuit memory of claim 9 wherein the first logic portion is under control of a first control signal, and the second logic portion is under control of a second control signal.

11. An integrated circuit memory comprising:
a memory array coupled to an internal data line;
an ECC logic circuit for providing correct output data;
an ECC test circuit interposed between the internal data line and an input of the ECC logic circuit;
a test mode register; and
a predecoder coupled between the test mode register and the ECC test circuit, wherein the test mode register generates an enable signal received by the predecoder and the ECC test circuit forces a specific data state on a select data bit onto the input of the ECC logic circuit when the memory array is read.

12. The integrated circuit memory of claim 11 wherein the ECC test circuit comprises at least one control signal input.

13. The integrated circuit memory of claim 11 wherein the ECC test circuit forces a logic zero onto the input of the ECC logic circuit.

14. The integrated circuit memory of claim 11 wherein the ECC test circuit forces a logic one onto the input of the ECC logic circuit.

15. The integrated circuit memory of claim 11 wherein the ECC test circuit selectively forces either a logic zero or a logic one onto the input of the ECC logic circuit.

16. An integrated circuit memory comprising:
a memory array coupled to an internal data line;
an ECC logic circuit for providing correct output data;
an ECC test circuit interposed between the internal data line and an input of the ECC logic circuit;
a test mode register; and
a predecoder coupled between the test mode register and the ECC test circuit, wherein the test mode register generates an enable signal received directly by the ECC test circuit and the ECC test circuit forces a specific data state on a select data bit onto the input of the ECC logic circuit when the memory array is read.

17. The integrated circuit memory of claim 16 wherein the ECC test circuit comprises at least one control signal input.

18. The integrated circuit memory of claim 16 wherein the ECC test circuit forces a logic zero onto the input of the ECC logic circuit.

19. The integrated circuit memory of claim 16 wherein the ECC test circuit forces a logic one onto the input of the ECC logic circuit.

20. The integrated circuit memory of claim 16 wherein the ECC test circuit selectively forces either a logic zero or a logic one onto the input of the ECC logic circuit.

* * * * *